(12) United States Patent
Briggs et al.

(10) Patent No.: US 9,941,211 B1
(45) Date of Patent: Apr. 10, 2018

(54) REDUCING METALLIC INTERCONNECT RESISTIVITY THROUGH APPLICATION OF MECHANICAL STRAIN

(71) Applicant: International Business Machines Corporation, Armonk, NY (US)

(72) Inventors: Benjamin D. Briggs, Waterford, NY (US); Lawrence A. Clevenger, LaGrangeville, NY (US); Nicholas A. Lanzillo, Troy, NY (US); Michael Rizzolo, Albany, NY (US); Theodorus E. Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/468,972

(22) Filed: Mar. 24, 2017

(51) Int. Cl.
*H01L 23/52* (2006.01)
*H01L 23/528* (2006.01)
*H01L 21/768* (2006.01)
*H01L 21/02* (2006.01)
(Continued)

(52) U.S. Cl.
CPC .... *H01L 23/5283* (2013.01); *H01L 21/02167* (2013.01); *H01L 21/76816* (2013.01); *H01L 21/76828* (2013.01); *H01L 21/76846* (2013.01); *H01L 21/76849* (2013.01); *H01L 21/76864* (2013.01); *H01L 23/5226* (2013.01);
(Continued)

(58) Field of Classification Search
CPC ............. H01L 23/53238; H01L 23/528; H01L 23/5283; H01L 23/5226; H01L 21/76849; H01L 23/5329; H01L 23/53223; H01L 21/76846; H01L 21/76864; H01L 21/02167; H01L 21/76828

USPC ........................................................ 257/762
See application file for complete search history.

(56) References Cited

U.S. PATENT DOCUMENTS 7,834,399 B2 11/2010 Kanarsky et al.
8,362,596 B2 1/2013 Cohen et al.
9,257,329 B2 * 2/2016 Mieth ............... H01L 21/76807
(Continued)

OTHER PUBLICATIONS

N. Dole et al., "Strained Annealing of Cu Interconnects—The Novel Approach Towards Improving Resistance of Cu Nanostructures," TECHCON, BEOL Processing and Reliability, 2013, 4 pages.
(Continued)

*Primary Examiner* — Luan C Thai
(74) *Attorney, Agent, or Firm* — Vazken Alexanian; Ryan, Mason & Lewis, LLP

(57) ABSTRACT

Methods are provided for fabricating metallic interconnect structures having reduced electrical resistivity that is obtained by applying mechanical strain to the metallic interconnect structures, as well as semiconductor structures having metallic interconnect structures formed with permanent mechanical strain to provide reduced electrical resistivity. For example, a method includes forming a metallic interconnect structure in an interlevel dielectric (ILD) layer of a back-end-of-line (BEOL) structure of a semiconductor structure, and forming a stress layer in contact with the metallic interconnect structure. A thermal anneal process is performed to cause the stress layer to expand and apply compressive strain to the metallic interconnect structure and permanently deform at least a portion of the metallic interconnect structure into a stress memorized state of compressive strain.

14 Claims, 9 Drawing Sheets

(51) Int. Cl.
*H01L 23/532* (2006.01)
*H01L 23/522* (2006.01)

(52) U.S. Cl.
CPC .... *H01L 23/5329* (2013.01); *H01L 23/53223* (2013.01); *H01L 23/53238* (2013.01)

(56) References Cited

U.S. PATENT DOCUMENTS

| | | | |
|---|---|---|---|
| 9,305,781 | B1 | 4/2016 | Mochizuki et al. |
| 9,330,974 | B2* | 5/2016 | Kim .................. H01L 21/76898 |
| 9,437,540 | B2* | 9/2016 | Lin ..................... H01L 23/5226 |
| 9,576,894 | B2* | 2/2017 | Singh ................ H01L 21/31144 |
| 9,786,760 | B1* | 10/2017 | Bonilla ............... H01L 29/4991 |
| 2007/0105299 | A1 | 5/2007 | Fang et al. |
| 2008/0197513 | A1 | 8/2008 | Restaino et al. |
| 2009/0001591 | A1 | 1/2009 | Haverty et al. |
| 2017/0069619 | A1* | 3/2017 | Toh .................... H01L 27/0266 |

OTHER PUBLICATIONS

A. Mishra et al., "Microstructural Evolution in Copper Subjected to Severe Plastic Deformation: Experiments and Analysis," Acta Materialia, Jan. 2007, pp. 13-28, vol. 55, No. 1.

N.A. Lanzillo et al., "Pressure-Enabled Phonon Engineering in Metals," Proceedings of the National Academy of Sciences the United States of America (PNAS), Jun. 17, 2014, pp. 8712-8716, vol. 111, No. 24.

M. Horstmann et al., "Integration and Optimization of Embedded-SiGe, Compressive and Tensile Stressed Liner Films, and Stress Memorization in Advanced SOI CMOS Technologies," IEEE International in Electron Devices Meeting (IEDM), Dec. 5, 2015, 4 pages.

List of IBM Patents or Patent Applications Treated as Related.

U.S. Appl. No. 15/811,129 filed in the name of Benjamin D. Briggs et al. on Nov. 11, 2017 and entitled "Reducing Metallic Interconnect Resistivity Through Application of Mechanical Strain".

* cited by examiner

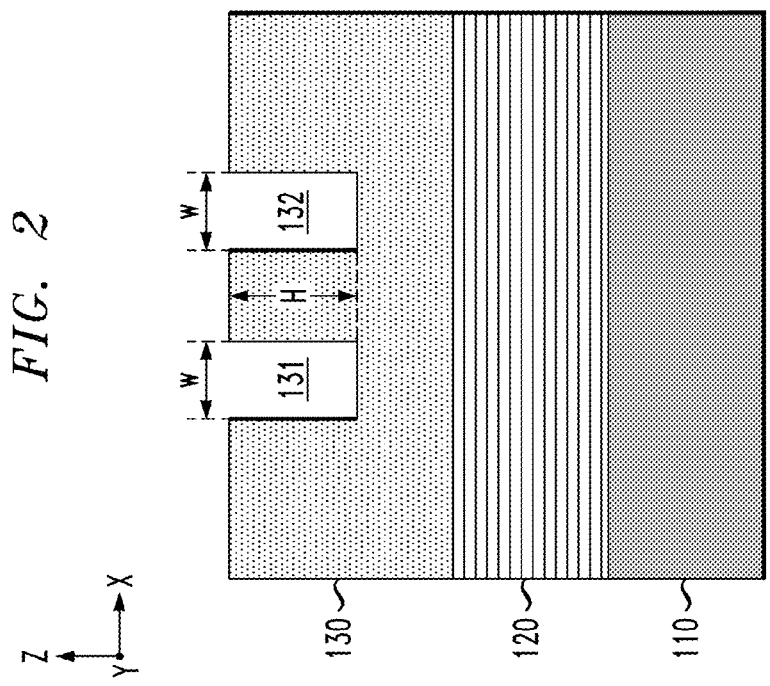

REDUCING METALLIC INTERCONNECT RESISTIVITY THROUGH APPLICATION OF MECHANICAL STRAIN

TECHNICAL FIELD

This disclosure generally relates to semiconductor fabrication techniques and, more specifically, to techniques for fabricating metallic interconnect structures.

BACKGROUND

A semiconductor integrated circuit chip is typically fabricated with a back-end-of-line (BEOL) interconnect structure, which comprises multiple levels of metal lines and inter-level metal vias, to connect various integrated circuit components and devices that are fabricated as part of a front-end-of-line (FEOL) layer of the semiconductor integrated circuit chip. Current state of the art BEOL process technologies typically use copper to form BEOL interconnect structures, as copper has low resistance, which results in interconnect structures with improved conduction and higher device performance. As copper interconnect structures are scaled down in size, however, resistivity of the copper interconnect structures increases exponentially, which is undesirable.

SUMMARY

Embodiments of the invention include methods for fabricating metallic interconnect structures having reduced electrical resistivity that is obtained by applying mechanical strain to the metallic interconnect structures, as well as semiconductor structures comprising metallic interconnect structures formed with permanent mechanical strain to provide reduced electrical resistivity.

For example, one embodiment includes a method which comprises forming a metallic interconnect structure in an interlevel dielectric (ILD) layer of a BEOL structure of a semiconductor structure and forming a stress layer in contact with the metallic interconnect structure. A thermal anneal process is performed to cause the stress layer to expand and apply compressive strain to the metallic interconnect structure and permanently deform at least a portion of the metallic interconnect structure into a stress memorized state of compressive strain.

Another embodiment includes a semiconductor structure. The semiconductor structure comprises a BEOL structure formed on a substrate, wherein the BEOL structure comprises a metallic interconnect structure formed in an ILD layer of the BEOL structure, and wherein at least a portion of the metallic interconnect structure is in a stress memorized state of compressive strain. The stress memorized state of compressive strain results in a reduced electrical resistivity of the metallic interconnect structure Other embodiments will be described in the following detailed description of embodiments, which is to be read in conjunction with the accompanying figures.

BRIEF DESCRIPTION OF THE DRAWINGS

FIGS. 1-7 schematically illustrate a method for fabricating metallic interconnect structures with reduced electrical resistivity that is obtained by applying mechanical strain to the metallic interconnect structures, according to an embodiment of the invention wherein:

FIG. 1 is a cross-sectional schematic side view of a semiconductor device at an intermediate stage of fabrication comprising a semiconductor substrate, and a FEOL/MOL (middle-of-line) structure and an ILD layer formed on the semiconductor substrate;

FIG. 2 is a cross-sectional schematic side view of the semiconductor device of FIG. 1 after etching trench openings in the ILD layer;

FIG. 3 is a cross-sectional schematic side view of the semiconductor device of FIG. 2 after depositing a layer of metallic material to fill the trench openings in the ILD layer with metallic material;

FIG. 4 is a cross-sectional schematic side view of the semiconductor structure of FIG. 3 after planarizing the surface of the semiconductor structure down to the ILD layer to remove overburden metallic material and form metal lines;

FIG. 7 schematically illustrates a step of subjecting the semiconductor structure of FIGS. 6A and 6B to a thermal anneal process to cause the stress layer to expand and apply a compressive force to the metal lines.

FIGS. 8, 9, 10, and 11 schematically illustrate a method for fabricating metallic interconnect structures with reduced electrical resistivity that is obtained by applying mechanical strain to the metallic interconnect structures, according to another embodiment of the invention, wherein:

FIG. 8 is a cross-sectional schematic side view of the semiconductor structure of FIG. 6A after depositing a layer of dielectric material over the surface of the semiconductor structure to form a stress layer;

FIG. 9 schematically illustrates a step of subjecting the semiconductor structure of FIG. 8 to a thermal anneal process to cause the stress layer to expand and apply a compressive force to the metal lines;

FIG. 10 is a cross-sectional schematic side view of the semiconductor structure of FIG. 9 after removing the stress layer to expose the recessed region in the ILD layer; and FIG. 11 is a cross-sectional schematic side view of the semiconductor structure of FIG. 10 after forming a dielectric liner that surrounds the metal lines within the recessed region of the ILD layer.

FIGS. 12, 13, 14, 15, and 16 schematically illustrate a method for fabricating metallic interconnect structures with reduced electrical resistivity that is obtained by applying mechanical strain to the metallic interconnect structures, according to yet another embodiment of the invention, wherein:

FIG. 12 is a cross-sectional schematic side view of the semiconductor structure of FIG. 1 after patterning the ILD layer to form a dual damascene opening comprising a trench and via opening;

FIG. 13 is a cross-sectional schematic side view of the semiconductor structure of FIG. 12 after depositing a conformal layer of liner material to line surfaces of the dual damascene opening in the ILD layer with a thin liner layer;

FIG. 14 is a cross-sectional schematic side view of the semiconductor structure of FIG. 13 after depositing a layer of metallic material to fill the dual damascene opening with metallic material to form a metallic interconnect structure comprising a metal line and a metal via;

FIG. 15 is a cross-sectional schematic side view of the semiconductor structure of FIG. 14 after planarizing the surface of the semiconductor structure down to the ILD layer, and depositing a layer of dielectric material on the planarized surface to form a stress layer; and FIG. 16 schematically illustrates a step of subjecting the semiconductor structure of FIG. 15 to a thermal anneal process to cause the stress layer to expand and apply a compressive force to an upper surface of the underlying metallic interconnect structure.

DETAILED DESCRIPTION

Figure 4:
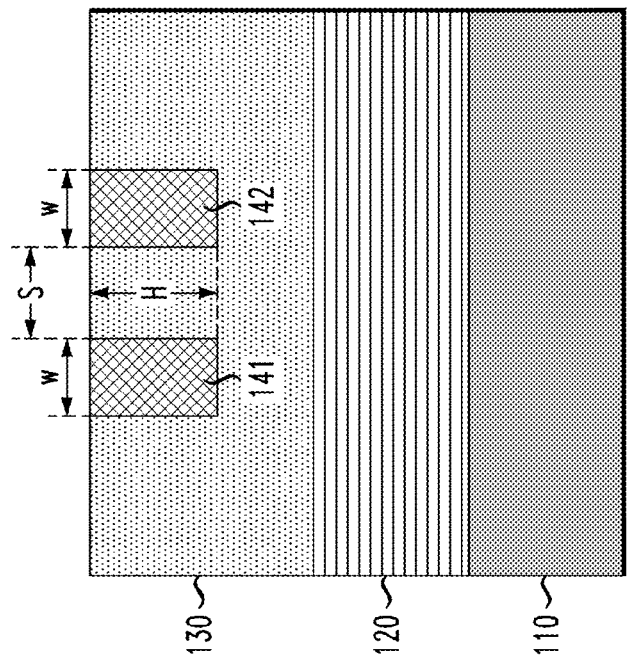

Embodiments of the invention will now be described in further detail with regard to methods for fabricating metallic interconnect structures having reduced electrical resistivity that is obtained by applying mechanical strain to the metallic interconnect structures, as well as semiconductor structures comprising metallic interconnect structures formed with permanent mechanical strain to provide reduced electrical resistivity. As explained in further detail below, embodiments of the invention implement stress layer fabrication and thermal annealing as part of BEOL process modules for applying compressive strain to metallic interconnect structures. A thermal anneal process is performed to cause a stress layer to expand and apply compressive strain to a metallic interconnect structure and permanently deform at least a portion of the metallic interconnect structure into a compressed state. The permanent compressed state results in a reduced electrical resistivity of the metallic interconnect structure.

It is to be understood that the various layers, structures, and regions shown in the accompanying drawings are schematic illustrations that are not drawn to scale. In addition, for ease of explanation, one or more layers, structures, and regions of a type commonly used to form semiconductor structures or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all the processing steps that may be required to form a functional semiconductor integrated circuit device. Rather, certain processing steps that are commonly used in forming semiconductor structures, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

To provide spatial context, XYZ Cartesian coordinates are shown in the drawings of semiconductor structures. It is to be understood that the term "vertical" as used herein denotes a Z-direction of the Cartesian coordinates shown in the drawings, and that the terms "horizontal" or "lateral" as used herein denotes an X-direction and/or Y-direction of the Cartesian coordinates shown in the drawings, which is perpendicular to the Z-direction.

FIGS. 1-7 schematically illustrate a method for fabricating metallic interconnect structures with reduced electrical resistivity that is obtained by applying mechanical strain to the metallic interconnect structures, according to an embodiment of the invention. To begin, FIG. 1 is a cross-sectional schematic side view of a semiconductor structure 100 at an intermediate stage of fabrication comprising a semiconductor substrate 110 (e.g., semiconductor wafer), a FEOL/MOL structure 120 formed on the semiconductor substrate 110, and an ILD layer 130 formed on the FEOL/MOL structure 120. While the semiconductor substrate 110 and the FEOL/MOL structure 120 are illustrated as generic layers, it is to be understood that the semiconductor substrate 110 may comprise different types of substrate structures and materials, and that the FEOL/MOL structure 120 may comprises any type of semiconductor integrated circuitry and MOL contact framework.

For example, in one embodiment, the semiconductor substrate 110 may comprise a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. In another embodiment, the semiconductor substrate 110 may comprise a SOI (silicon on insulator) substrate, which comprises an insulating layer (e.g., oxide layer) disposed between a base substrate layer (e.g., silicon substrate) and an active semiconductor layer (e.g., active silicon layer) in which active circuit components (e.g., field effect transistors) are formed as part of a FEOL layer of the FEOL/MOL structure 120.

The FEOL/MOL structure 120 comprises a FEOL layer formed on the semiconductor substrate 110. The FEOL layer comprises various semiconductor devices and components that are formed in or on the active surface of the semiconductor substrate 110 to provide integrated circuitry for a target application. For example, the FEOL layer comprises FET devices (such as FinFET devices, planar MOSFET device, etc.), bipolar transistors, diodes, capacitors, inductors, resistors, isolation devices, etc., which are formed in or on the active surface of the semiconductor substrate 110. In general, FEOL processes typically include preparing the semiconductor substrate 110 (or wafer), forming isolation structures (e.g., shallow trench isolation), forming device wells, patterning gate structures, forming spacers, forming source/drain regions (e.g., via implantation), forming silicide contacts on the source/drain regions, forming stress liners, etc.

The FEOL/MOL structure 120 further comprises a MOL layer formed on the FEOL layer. In general, the MOL layer comprises a PMD (pre-metal dielectric layer) and conductive contacts (e.g., via contacts) that are formed in the PMD layer. The PMD layer is formed on the components and devices of the FEOL layer. A pattern of openings is formed in the PMD layer, and the openings are filled with a conductive material, such as tungsten, cobalt, etc., to form conducive via contacts that are in electrical contact with device terminals (e.g., source/drain regions, gate contacts, etc.) of the integrated circuitry of the FEOL layer. The conductive via contacts of the MOL layer provide electrical connections between the integrated circuitry of the FEOL layer and a first level of metallization of a BEOL structure that is formed over the FEOL/MOL structure 120.

In the example embodiment of FIG. 1, the ILD layer 130 comprises a first ILD layer of a BEOL interconnect structure that is formed on the FEOL/MOL structure 120. The ILD layer 130 may comprise any suitable dielectric material that is commonly utilized in BEOL process technologies. For example, the ILD layer 130 can be formed of a dielectric material including, but not limited to, silicon oxide (e.g. $SiO_2$), silicon nitride (e.g., ($Si_3N_4$), hydrogenated silicon carbon oxide (SiCOH), SiCH, SiCNH, or other types of silicon-based low-k dielectrics (e.g., k less than about 4.0), porous dielectrics, or known ULK (ultra-low-k) dielectric materials (with k less than about 2.5). The ILD layer 130 may be deposited using known deposition techniques, such as, for example, atomic layer deposition (ALD), physical vapor deposition (PVD), chemical vapor deposition (CVD), plasma-enhanced CVD (PECVD), spin-on deposition, etc. The thickness of the ILD layer 130 will vary depending on the application, and may have a thickness in a range of about 30 nm to about 200 nm, for example.

A next stage of the fabrication process comprises patterning the ILD layer 130 to form trenches and/or via openings that define a pattern of metallization and/or vertical interconnects that are formed in the given ILD layer 130. For example, FIG. 2 is a cross-sectional schematic side view of the semiconductor structure of FIG. 1 after etching trench openings 131 and 132 in the ILD layer 130. In the example embodiment of FIG. 2, the trench openings 131 and 132 are defined by a height H and a width W. The width W at half-height defines the "critical dimension" (CD) of metallic interconnects (e.g., metal wires) which are subsequently formed by filling the trench openings 131 and 132 with metallic material. The width W is fixed by the CD of the particular fabrication process that is implemented. The trench openings 131 and 132 define an "aspect ratio" of the metal lines, wherein the aspect ratio AR of the metal lines is determined as, $$AR = \frac{H}{W}.$$

While FIG. 2 shows a pair of trench openings 131 and 132 which correspond to metal lines to be formed in the ILD layer 130, it is to be understood that the ILD layer 130 may be patterned to form via openings which correspond to metallic vias that are formed to vertically connect the metal lines to MOL contacts in the underlying FEOL/MOL structure 120. In one embodiment, a single damascene process can be implemented in which metallic lines (e.g., copper wiring) and metallic vias (e.g., vertical copper interconnects) are separately formed in different ILD layers of the BEOL structure. For instance, in the example embodiment of FIG. 2, the portion of the ILD layer 130 below the trench openings 131 and 132 may be a separate ILD layer (e.g., a first ILD layer) that is previously deposited and patterned to form metallic vias using a single damascene process, wherein the trench openings 131 and 132 are formed by depositing and patterning another ILD layer (e.g. second ILD layer) to form metal lines that are aligned to, and in contact with, the underlying metallic vias.

In other embodiments, trench and via openings can be etched in the same ILD layer (e.g., the ILD layer 130) and filled with metallic material using one of various "dual damascene" patterning techniques known in the art, wherein trenches and via openings are patterned in the same ILD layer and concurrently filled with metallic material to form metallic vias and metal lines. The dual damascene patterning methods include a "via first" process, a "trench first" process, and a "buried via" process, wherein such processes comprise different sequences for etching the ILD layer 130 to pattern the via openings and trench openings, while concurrently filling the via openings and trench openings with metallic material. The single and dual damascene patterning methods can be implemented using any conventional photolithography and etching process, e.g., forming a photoresist mask and etching the dielectric material of the ILD layer 130 using a dry etch process such as RIE (reactive ion etching), etc. Following the patterning of the ILD layer 130 shown in FIG. 2, any suitable BEOL cleaning technique can be implemented to remove the etch residues from the exposed surfaces of the ILD layer 130.

Figure 3:
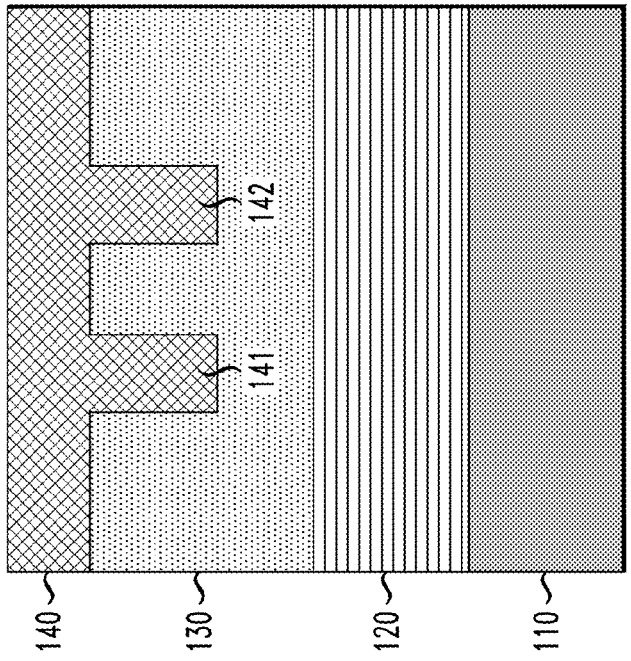

A next step in the fabrication process comprises depositing a layer of metallic material using a dry or wet deposition process to fill the trenches and/or via openings in the ILD layer 130 with metallic material. In particular, FIG. 3 is a cross-sectional schematic side view of the semiconductor structure of FIG. 2 after depositing a layer of metallic material 140 to fill the trench openings 131 and 132 in the ILD layer 130 with metallic material. As depicted in FIG. 3, the metallic material within the trench openings 131 and 132 form metal wires 141 and 142, respectively, and the metallic material disposed over the surface of the ILD layer 130 comprises overburden metallic material which is subsequently removed. In one embodiment of the invention, the layer of metallic material 140 comprises copper (Cu). In other embodiments, the metallic material 140 can be, for example, aluminum (Al), tungsten (W), cobalt (Co), ruthenium (Ru), iridium (Ir), rhodium (Rh), nickel (Ni), or alloys thereof. The layer of metallic material 140 is deposited using known dry deposition techniques such as ALD, PVD, CVD, etc., or wet deposition techniques such as electroplating, and electroless plating, etc.

The layer of metallic material 140 as deposited may comprise a polycrystalline microstructure. The polycrystalline microstructure comprises a mosaic of very small single crystals (on the order of nanometer grain sizes), which are randomly distributed (random texture) with no preferred orientation (e.g., no grain direction). A polycrystalline microstructure tends to decrease the electrical conductivity of the metallic material, as well as increase electromigration within the metallic material due to the electron diffusion paths that exist along the various grain boundaries in the polycrystalline microstructure of the metallic material. In this regard, at this stage of the fabrication process, an optional thermal annealing process may be performed to thermally anneal the layer of metallic material 140 to promote recrystallization and grain growth of the microstructure of the metallic material 140 and thereby convert the polycrystalline microstructure of the metallic material 140 into a different microstructure comprising larger grains with a given grain direction (e.g., a bamboo or columnar microstructure). The grain growth serves to reduce the resistivity of the metallic material 140. The recrystallization and grain growth of the microstructure of the metallic material 140 can be implemented using any known state of the art process for modulating the microstructure of the metallic material, which is suitable for the given application.

Following the deposition of the layer of metallic material 140 and the optional microstructure modulation process, the overburden metallic material is removed by planarizing the surface of the semiconductor structure down to the ILD layer 130. In particular, FIG. 4 is a cross-sectional schematic side view of the semiconductor structure of FIG. 3 after planarizing the surface of the semiconductor structure down to the ILD layer 130 to remove the overburden metallic material. In one embodiment, the planarizing process is performed using a chemical-mechanical planarizing (CMP) process with a chemical slurry that is suitable to etch the metallic material. The CMP process results in the formation of the metal lines 141 and 142 in the ILD layer 130, as shown in FIG. 4. In one embodiment of the invention, after performing the CMP process, an optional protective layer can be formed on the exposed surfaces of the metal lines 141 and 142 to protect the metallization from potential damage as a result of subsequent etching processes. For example, for copper metallization, a selective Co deposition process can be performed to selectively deposit a thin capping layer of Co on the exposed surfaces of the metal lines 141 and 142 shown in FIG. 4. A protective Co capping layer on the metal lines 141 and 142 would allow for more aggressive etching conditions, etc., during subsequent etching processes as discussed below.

In the example embodiment of FIG. 4, the metal lines 141 and 142 have the same width W and height H and, thus, have a same aspect ratio, $$AR = \frac{H}{W}.$$

In one embodiment of the invention, the width W of the metal lines 141 and 142 is in a range of about 2 nm to about 25 nm, and the height H of the metal lines 141 and 142 is selected to achieve an aspect ratio (AR) of about 2.6 or lower. The resistance R of each metal line 141 and 142 is determined as $$R = \rho \frac{L}{A},$$

where $\rho$ is the resistivity of the metallic material that forms the metal lines 141 and 142, where L is the length of the metal lines 141 and 142 (see FIG. 5B), and where A is the cross-sectional area (H×W) of the metal lines 141 and 142. For a given type of metallic material (e.g., copper), the resistivity $\rho$ of the metal lines 141 and 142 depends on factors such as the aspect ratio (AR) of the metal lines 141 and 142, and the cross-sectional area A (where A=H×W) of the metal lines 141 and 142. In the example illustrations, the cross-sectional area A of each metal line 141 and 142 defines a plane (X-Z plane) that is perpendicular to the direction of conducting current which flows along the length L of the metal lines 141 and 142 in the Y-direction (see FIG. 5B).

For example, for a given aspect ratio $$AR = \frac{H}{W}$$

of a metal line formed of a given metallic material, the resistivity $\rho$ of the metal line increases as the conducting cross-sectional area (H×W) decreases. On the other hand, for a given technology node with a fixed W, it is desirable to reduce the height H of the metal lines (and thus reduce the aspect ratio AR of the metal lines) to decrease capacitive coupling between adjacent metal lines. While a smaller aspect ratio metal line can be realized by reducing the height H of the metal line for a given width W, the reduction in the height H of the metal line results in a decrease of the cross-sectional area A of the metal line, and thus, an increase in the resistivity $\rho$ (and resistance R) of the metal line.

To further reduce the resistivity $\rho$ (and thus reduce the resistance R) of the metal lines 141 and 142, various techniques according to embodiments of the invention are implemented to apply compressive strain to the metal lines 141 and 142 to permanently deform at least a portion of each of the metal lines 141 and 142 into compressed stress memorized state. The application of compressive stress to BEOL metal lines, for example, allows for a reduction in the aspect ratio of metal lines such that the lower aspect ratio "compressed" metal lines have similar target resistivity/resistance values as the higher aspect ratio "uncompressed" metal lines. For example, assuming a fixed width W for a given technology node (e.g., 7 nm and beyond), a compressive stress memorized metal line with an aspect ratio of 2.2 would have a similar resistivity/resistance as a non-stressed metal line with an aspect ratio of 2.6. The reduction in the aspect ratio of the metal lines (e.g., reducing height H) using stress memorization techniques provides an added advantage of reducing the parasitic capacitance and coupling between adjacent metal lines.

Figure 5B:
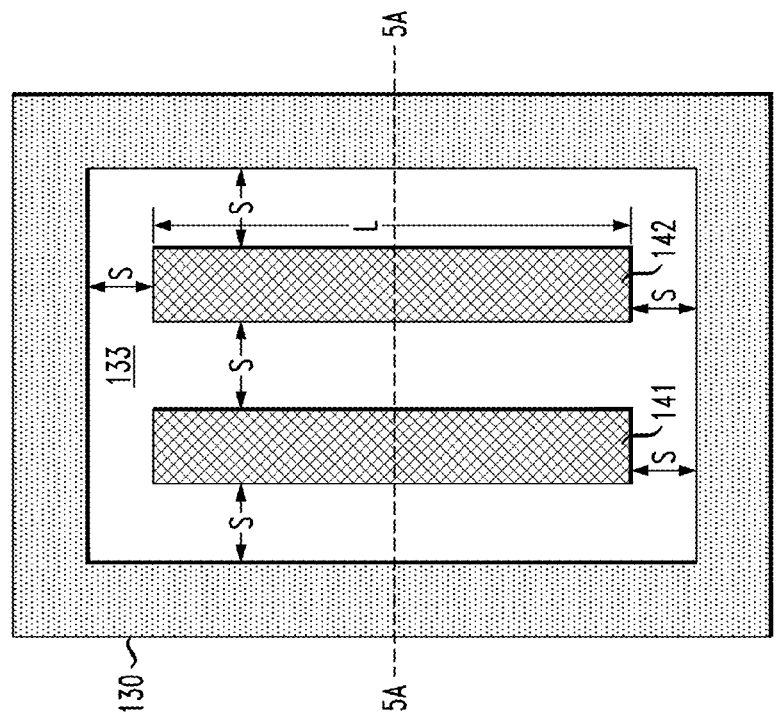
FIGS. 5A and 5B are schematic views of the semiconductor structure of FIG. 4 after etching away a portion of the ILD layer surrounding the metal lines to form a recessed region within the ILD layer.
Figure 5A:
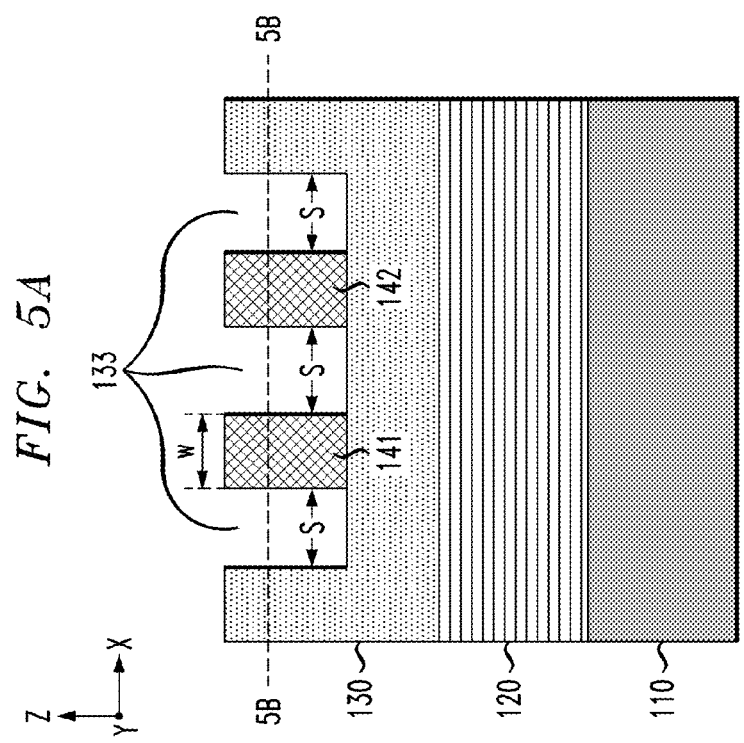

Referring now to FIGS. 5A and 5B, a next stage in the fabrication process comprises removing a portion of the ILD layer 130 surrounding the metal lines 141 and 142, and depositing a layer of dielectric material which serves as a stress layer that is thermally annealed to apply compressive strain to the metal lines 141 and 142. In particular, FIGS. 5A and 5B are schematic views of the semiconductor structure of FIG. 4 after etching down a portion of the ILD layer 130 surrounding the vertical sidewalls of the metal lines 141 and 142 to form a recessed region 133 within the ILD layer 130. FIG. 5B is a schematic plan view of the semiconductor structure of FIG. 5A along an X-Y plane that includes line 5B-5B shown in FIG. 5A, and FIG. 5A is a cross-sectional side view (X-Z plane) of the semiconductor structure taken along line 5A-5A in FIG. 5B. In one embodiment, any suitable masking (e.g., photoresist mask) and etching technique (e.g., RIE (reactive ion etch)) can be used to pattern the ILD layer 130 to form the recessed region 133.

By way of example, in one embodiment, the recessed region 133 is formed using a standard photolithographic technique which comprises forming a photoresist mask over the planarized surface of the semiconductor structure shown in FIG. 4, wherein the photoresist mask comprises an opening that defines the recessed region 133, and etching the exposed area of the ILD layer 130 selective to the material of the metal lines 141 and 142 to recess the exposed area of the ILD layer 130 down to a target depth. In one embodiment, a dry etch technique (e.g., RIE) with a fluorine-based etchant may be implemented to etch the dielectric material of the ILD layer 130 using a timed etch process to recess the exposed area of the ILD layer 130 down to level that is substantially level with a bottom of the metal lines 141 and 142, as schematically illustrated in FIG. 5A. Further, in one embodiment of the invention, the recessed region 133 is formed such that a spacing S between sidewalls of the metal lines 141 and 142 and adjacent vertical sidewalls of the recessed region 133 within the ILD layer 130 is substantially equal to the spacing S between the metal lines 141 and 142. In one embodiment, the spacing S is substantially equal to the width W of the metal lines 141 and 142 (e.g., S=W).

Figure 6B:
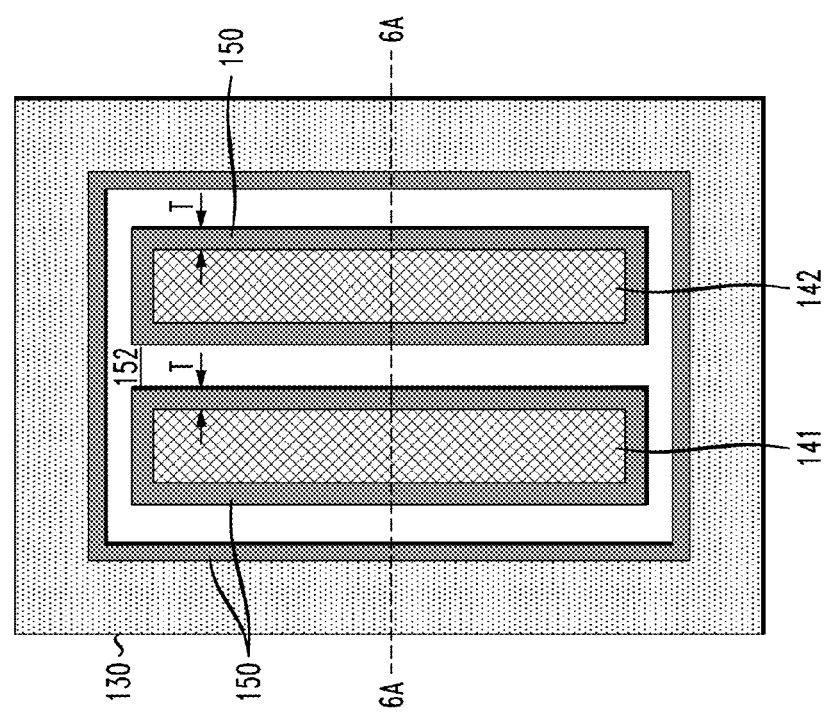
FIGS. 6A and 6B are schematic views of the semiconductor structure of FIGS. 5A and 5B, respectively, after depositing a layer of dielectric material over the surface of the semiconductor structure to form a stress layer.
Figure 6A:
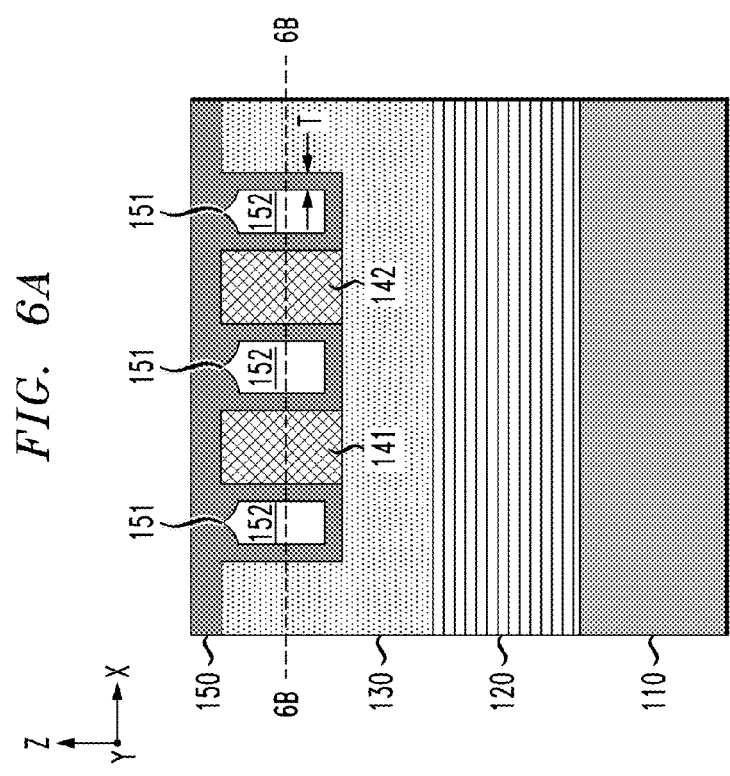

Next, FIGS. 6A and 6B are schematic views of the semiconductor structure of FIGS. 5A and 5B, respectively, after depositing a layer of dielectric material over the surface of the semiconductor structure to form a stress layer 150. FIG. 6B is a schematic plan view of the semiconductor structure of FIG. 6A along an X-Y plane that includes line 6B-6B shown in FIG. 6A, and FIG. 6A is a cross-sectional side view (X-Z plane) of the semiconductor structure taken along line 6A-6A in FIG. 6B. In the example embodiment of FIGS. 6A and 6B, the stress layer 150 is formed by depositing a layer of dielectric material using a non-conformal deposition process (e.g., PECVD or PVD) to cause pinch-off regions 151 to form in the deposited dielectric material over the spaces S between, and adjacent to, the metal lines 141 and 142.

As shown in FIGS. 6A and 6B, the formation of the stress layer 150 with the pinch-off regions 151 results in the formation of air gaps 152 within the spaces S between, and adjacent to, the metal lines 141 and 142, wherein the air gaps 152 surround the sidewalls of the metal lines 141 and 142. As further shown in FIGS. 6A and 6B, when depositing the dielectric material to form the stress layer 150, prior to formation of the pinch-off regions 151, a thin layer of the dielectric material (with thickness T) is deposited on the sidewalls of the metal lines 141 and 142 and on the sidewalls and bottom (recessed) surface of the recessed region 133 of the ILD layer 130. Following deposition of the dielectric material used to form the stress layer 150, a CMP process may be performed to planarize the stress layer 150, resulting in the semiconductor structure shown in FIGS. 6A and 6B.

In one embodiment of the invention, the stress layer 150 is formed with a dielectric material which has a coefficient of thermal expansion (CTE) that is greater than the CTE of the metallic material (e.g., Cu) that forms the metal lines 141 and 142. For example, in one embodiment of the invention, the stress layer 150 is formed of silicon carbon nitride (SiCN) or any other suitable dielectric material with a CTE which is greater than the CTE of the metallic material of the metal lines 141 and 142. The type of dielectric material (e.g., low-k, ultra-low-k (ULK), or high-k) which is used to form the stress layer 150 can also depend on whether the stress layer 150 will remain as part of the BEOL structure to serve as a dielectric liner layer, or be removed and replaced with another dielectric material. For example, if the stress layer 150 remains as part of the BEOL structure, it is preferable to form the stress layer 150 using a low-k or ULK dielectric material.

Furthermore, in one embodiment of the invention, the deposition parameters are selected so that the thickness T of the dielectric material that forms on the sidewall surfaces of the metal lines 141 and 142 (prior to pinch-off) is about 3 nm or greater. The structural characteristics (e.g., size, shape, volume, etc.) of the air gaps 152 and the amount (thickness T) of dielectric material that is formed on the sidewall surfaces of the metal lines 141 and 142 prior to "pinch-off" can be controlled based on various factors such as (i) the type of dielectric material(s) that are used to form the stress layer 150 and/or (ii) the deposition process and associated deposition parameters (e.g., gas flow rate, RF power, pressure, deposition rate, etc.) that are used to perform the pinch-off deposition. In one example embodiment of the invention, a pinch-off deposition process is implemented by depositing a SiCN dielectric film via a plasma CVD deposition process using an industrial parallel plate single wafer 300 mm CVD reactor with deposition parameters such as: Gas [Trimethyl Silane (200-500 standard cubic centimeter per minute (sccm)) and Ammonia (300-800 sccm)]; RF power [300-600 Watts]; Pressure [2-6 Torr]; and deposition rate [0.5-5 nm/sec].

Figure 7:
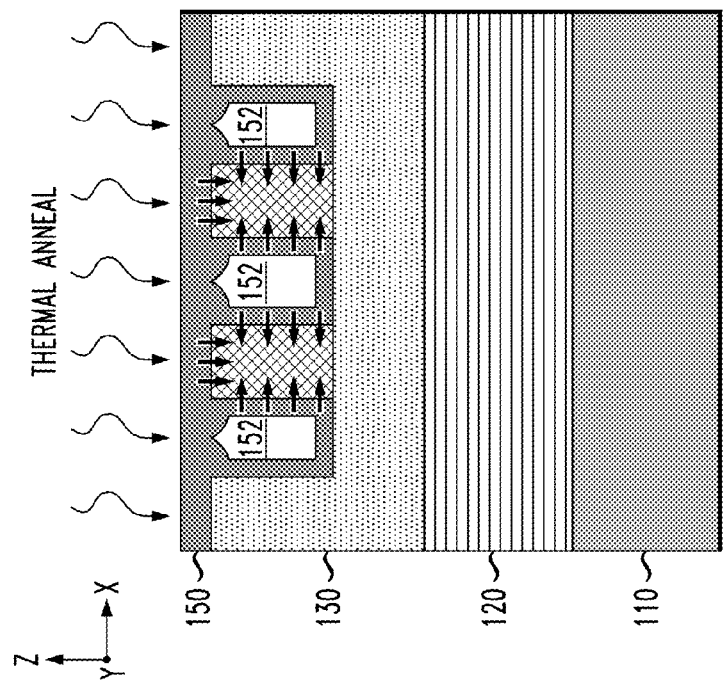

Referring now to FIG. 7, a next step in the fabrication process comprises performing a thermal anneal process to cause the stress layer 150 to expand (e.g., cause tensile strain within the stress layer 150) and apply a compressive force to the metal lines 141 and 142. In particular, as schematically shown in FIG. 7, a thermal anneal process is applied to heat the stress layer 150, thereby causing the stress layer 150 to expand and apply compressive forces to the vertical sidewall surfaces and the upper lateral surfaces of the metal lines 141 and 142, as indicated by the arrows shown in FIG. 7. Since the CTE of the stress layer 150 is greater than the CTE of the material that forms the metal lines 141 and 142, the compressive force applied to the metal lines 141 and 142 by the expansion of the stress layer 150 exceeds the opposing force applied to the stress layer 150 by the expansion of the metal lines 141 and 142, thus resulting in a net compressive force applied to the vertical sidewall surfaces and the upper lateral surfaces metal lines 141 and 142, as shown in FIG. 7.

In one embodiment of the invention, the thermal anneal process is performed at a given temperature and for a given period of time which is sufficient to cause the stress layer 150 to apply an amount of compressive stress to the metal lines 141 and 142 which, in turn, is sufficient to plastically deform (compress) the metallic lines 141 and 142 to a point at which the metal lines 141 and 142 are permanently deformed (e.g., compressive stress memorization) even when the compressive force is no longer applied by the stress layer 150.

For example, in one embodiment where the metal lines 141 and 142 are formed of copper, the plastic deformation of the copper metal lines 141 and 142 occurs when a compressive stress of about 450 megapascals (MPa) or greater is applied to the copper metal lines 141 and 142. In the example embodiment of FIG. 7 where the stress layer 150 is formed of SiCN with a thickness T of 3 nm or more, the SiCN stress layer 150 can apply a compressive stress to the metal lines 141 and 142 in a range of about 1 gigapascal (GPa) to about 5 GPa. The pascal is a unit of pressure or stress that is equivalent to one newton (1 N) of force applied over an area of one square meter (m²), i.e., $$1Pa = \frac{1N}{m^2}.$$

The application of the compressive strain to the metal lines 141 and 142 serves to reduce the resistivity of the metal lines 141 and 142 by a significant amount (e.g., a reduction in the resistivity in a range of about 3% or greater).

In particular, for metallic material such as copper and aluminum (and other types of metallic materials), the resistivity of the metallic material decreases with the application of pressure as a result of a weakened electron-phonon coupling as the crystal lattice of the metallic material is compressed. In this regard, a reduction in the electrical resistivity of the metallic material of the metal lines 141 and 142 is not dependent on the grain microstructure of the metallic material, as reduced electrical resistivity is realized in both polycrystalline and monocrystalline metallic microstructures upon the application of compressive strain.

The parameters of the thermal anneal process (e.g., temperature, time, etc.) will vary depending factors such as the type of dielectric material used to form the stress layer 150 and the type of metallic material used to form the metal lines 141 and 142. In one embodiment, the thermal anneal process is performed at a target temperature in a range of about 300 degrees Celsius to about 450 degrees Celsius for a target period of time in a range of about 1 hour to about 2 hours, and in a suitable gas atmosphere (e.g., mixture of hydrogen and nitrogen). After the thermal anneal process is complete, and the semiconductor structure cools down, the stress layer 150 returns to its equilibrium state, while the metal lines 141 and 142 remain in a compressive stress memorized state with decreased electrical resistivity.

The compressive stress techniques discussed herein allow for a reduction of about 3% or more (e.g., up to about 10%) in the resistivity of a metallic material (e.g., copper) with a given microstructure (e.g., polycrystalline or crystal structure) in a stress-memorized state, as compared to the resistivity of the metallic material with the given microstructure in an un-compressed state. The reduction in the resistivity allows for a relaxation in the aspect ratio (e.g., a reduction in aspect ratio from about 2.6 to about 2.2). For example, as noted above, assuming a fixed width W for a given technology node (e.g., 7 nm and beyond), a compressive stress-memorized metal line (e.g., copper) with an aspect ratio of 2.2 could have a similar resistivity/resistance as a non-stressed metal line (e.g., copper) with an aspect ratio of 2.6.

In the example embodiment of FIG. 7, the stress layer 150 serves multiple purposes. For example, as explained above, the stress layer 150 serves to apply compressive strain to the metal lines 141 and 142 during a thermal annealing process to impart a permanent compressive strain in the metallic material of the metal lines 141 and 142, which serves to reduce the resistivity of the metallic material. In addition, the stress layer 150 serves as a dielectric capping layer on which a next ILD layer is deposited to form a next level of the BEOL structure. In particular, in embodiments where the stress layer 150 is formed of a dielectric material (e.g., SiCN) which is non-reactive with the metallic material that is used to form the metal lines 141 and 142 and other metal interconnect structures that are formed in ILD layer 130, the stress layer 150 serves as a capping layer that insulates exposed surface portions of the metallization structures formed in the ILD layer 130 from the dielectric material of a next ILD layer formed on top of the current ILD layer 130. For example, in a BEOL structure using copper metallization, a SiCN dielectric stress layer 150 serves to improve interconnect reliability by preventing oxidation of the copper metallization and preventing copper material of the metallization structures from diffusing into the dielectric material of the ILD layers of the BEOL structure.

Furthermore, the air gaps 152 in the stress layer 150 serve multiple purposes. For example, during the thermal annealing process, the air gaps 152 provide room for the stress layer 150 to expand and apply compressive stress to the metal lines 141 and 142, without exerting too much stress on the surrounding features (e.g., the ILD layer 130). In particular, the presence of the air gaps 152 adjacent to the metal lines 141 and 142 allows the thin layer of dielectric material on the vertical sidewalls of the metal lines 141 and 142 to freely expand and apply compressive strain to the sidewalls of the metal lines 141 and 142.

In addition, in the example embodiment where the stress layer 150 is maintained (not removed) to serve as a capping layer, the air gaps 152 between the adjacent metal lines 141 and 142 serve to optimize the electrical performance of the BEOL structure by reducing the effective dielectric constant (and thus reducing the parasitic capacitance) between adjacent metal lines of a metal wiring layer formed in the ILD layer 130. Indeed, since the dielectric constant k of air is about unity (i.e., k≈1), which is much less than the dielectric constant of the dielectric material which forms the stress layer 150, the air gaps 152 provide a reduced effective dielectric constant in the space between the metal lines 141 and 142.

Figure 8:
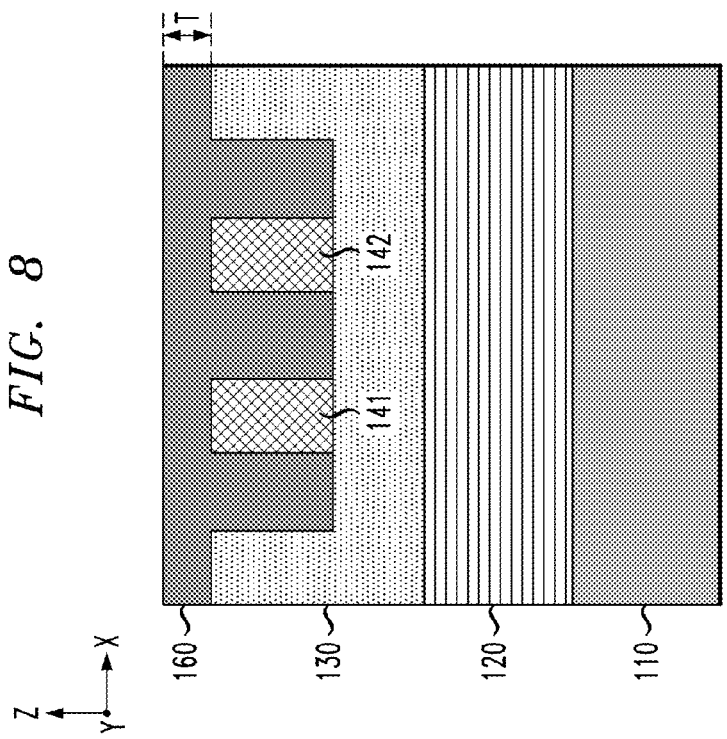

FIGS. 8-11 schematically illustrate a method for fabricating metallic interconnect structures with reduced electrical resistivity that is obtained by applying mechanical strain to the metallic interconnect structures, according to another embodiment of the invention. In one embodiment, the method of FIGS. 8-11 implements the initial process modules discussed above with regard to FIGS. 1-5B, wherein FIG. 8 is a cross-sectional schematic side view of the semiconductor structure of FIG. 6A after depositing a layer of dielectric material over the surface of the semiconductor structure to form a stress layer 160. In the example embodiment of FIG. 8, the stress layer 160 is formed by depositing a layer of dielectric material using a conformal deposition process to completely fill the recessed region 133 with dielectric material. In other words, as compared to the stress layer 150 shown in FIGS. 6A and 6B, the stress layer 160 shown in FIG. 8 is formed without air gaps in the spaces S between, and adjacent to, the metal lines 141 and 142. The stress layer 160 can be formed with a dielectric material (e.g., SiCN) that has a CTE which is greater than a CTE of the metallic material of the metal lines 141 and 142, and which is suitable to serve as a stress layer for the given application.

Figure 9:
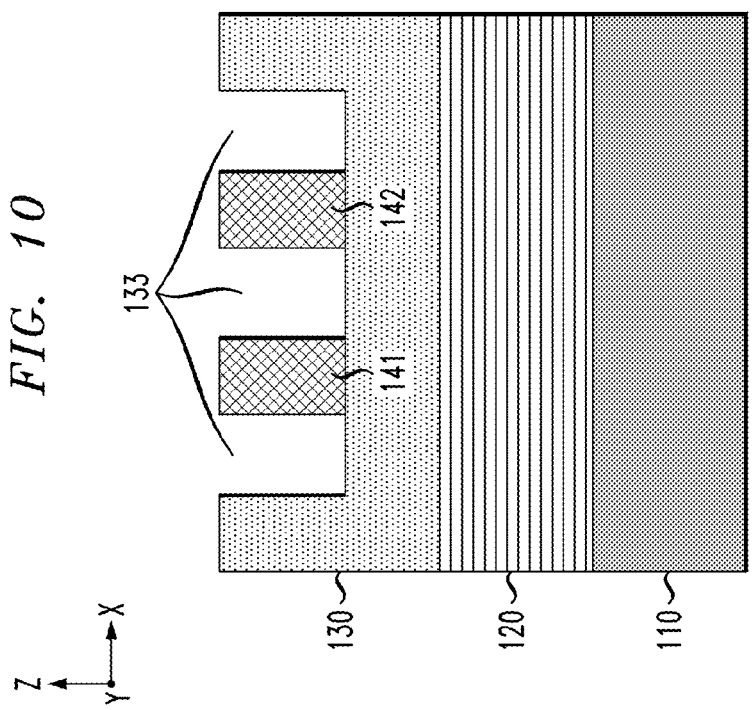

Referring now to FIG. 9, a next step in the fabrication process comprises performing a thermal anneal process to cause the stress layer 160 to expand (e.g., cause tensile strain within the stress layer 160) and apply a compressive force to the metal lines 141 and 142. In particular, as schematically shown in FIG. 9, a thermal anneal process is applied to heat the stress layer 160, thereby causing the stress layer 160 to expand and apply compressive forces to the vertical sidewall surfaces and upper lateral surfaces of the metal lines 141 and 142, as indicated by the arrows shown in FIG. 9. As discussed above, the parameters of the thermal anneal process (e.g., temperature, time period, etc.) are selected so that the tensile strain (expansion) of the stress layer 160 applies an amount of compressive stress to the metal lines 141 and 142 which, in turn, is sufficient to plastically deform (compress) the metallic lines 141 and 142 to a point at which the metal lines 141 and 142 are permanently deformed (e.g., compressive stress memorization) even when the compressive force is no longer applied by the stress layer 160.

Figure 10:
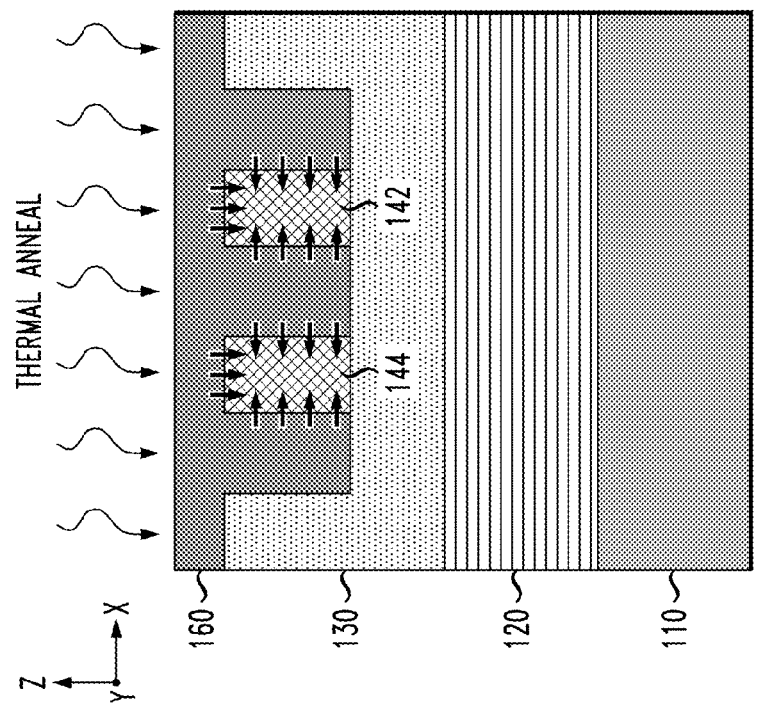

Following the thermal anneal process, the stress layer 160 can be removed and replaced with another layer of dielectric material which serves to enhance the electrical performance of the BEOL structure. For example, FIG. 10 is a cross-sectional schematic side view of the semiconductor structure of FIG. 9 after removing the stress layer 160 to expose the recessed region 133 of the ILD layer 130. The stress layer 160 can be removed using known techniques. For example, in an embodiment where there is etch selectivity between the materials of the ILD layer 130 and the stress layer 160, the stress layer 160 can be removed using a dry etch process (e.g., RIE) with an etch chemistry that is suitable to etch the stress layer 160 selective to the ILD layer 130 and the metal lines 141 and 142.

Figure 11:
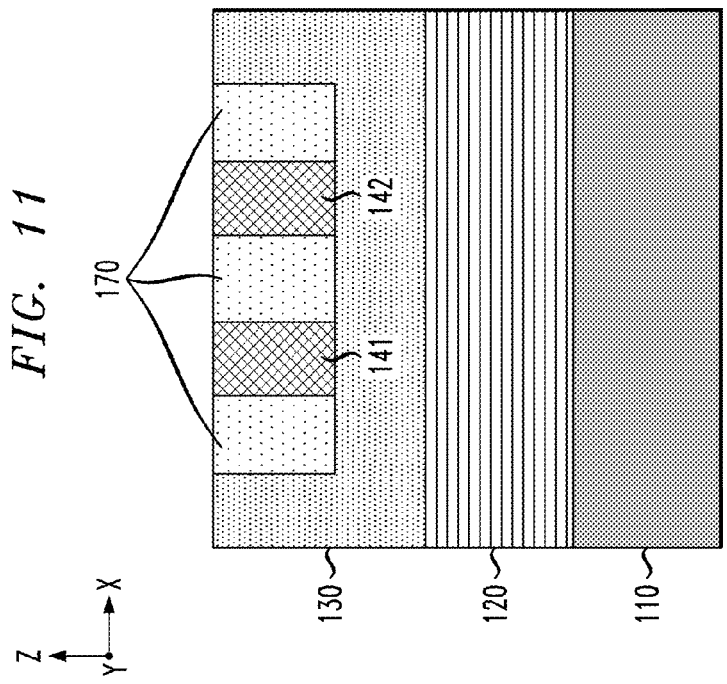

Next, FIG. 11 is a cross-sectional schematic side view of the semiconductor structure of FIG. 10 after forming a dielectric liner 170 which surrounds the metal lines 141 and 142 within the recessed region 133 of the ILD layer 130. In one embodiment, the dielectric liner 170 is formed by depositing a layer of dielectric material to fill the recessed region 133 with dielectric material, followed by a CMP process to remove the overburden dielectric material and planarize the surface of the semiconductor structure down to the ILD layer 130. The dielectric liner 170 can be formed of one or more dielectric materials which have desired electrical and mechanical characteristics (e.g., low leakage, high electrical breakdown, hydrophobic, low-k, etc.) that are desirable for high performance liners to enhance the performance and reliability of the BEOL interconnect structure. For example, the dielectric liner 170 can be formed from a dielectric material including, but not limited to, SiN, SiCN, SiNO, SiCNO, SiBN, SiCBN, SiC, SiCOH, or other types of silicon based low-k dielectrics, porous dielectrics, or ULK dielectric materials. The dielectric liner 170 can be deposited using known deposition techniques, such as, for example, ALD, CVD, PECVD, or PVD.

Following formation of the dielectric liner 170, a thin dielectric capping layer (e.g., SiN) can be formed on the planarized surface of the semiconductor shown in FIG. 11, followed by the deposition of another ILD layer which is patterned and processed to form a next level of metallization of the BEOL interconnect structure. In another embodiment of the invention, depending on the material used to form the stress layer 160 shown in FIGS. 8 and 9, the stress layer 160 can be maintained to serve as both a liner layer and a capping layer for the metal lines 141 and 142. In such embodiment, following the thermal anneal process in FIG. 9, the stress layer 160 would not be removed, and another ILD layer would be deposited on the stress layer 160. If desired, the overburden material of the stress layer 160 on the ILD layer 130 can be planarized or otherwise recessed via a suitable etch process prior to deposition of the next ILD layer to planarize the surface of the semiconductor structure or otherwise adjust a thickness of the overburden dielectric material of the stress layer 160 on the ILD layer 130 to a target thickness.

Figure 12:
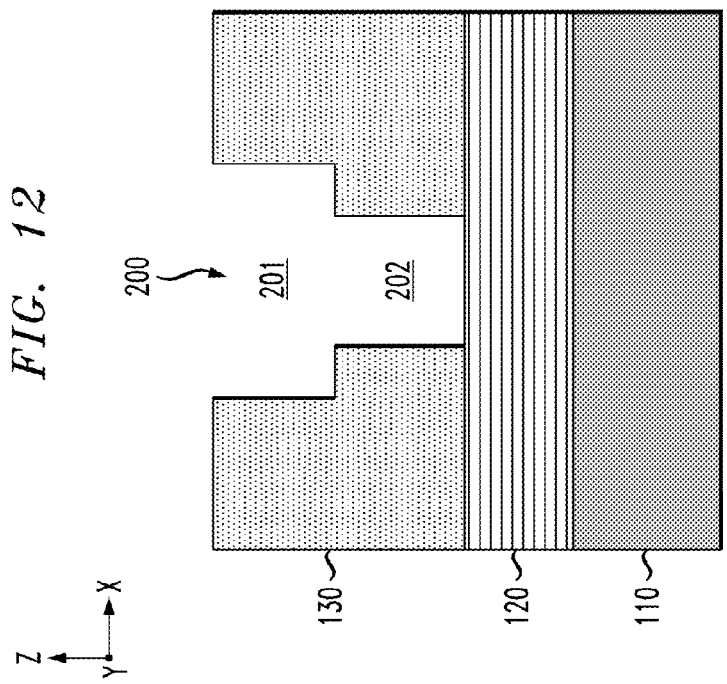

FIGS. 12~16 schematically illustrate a method for fabricating metallic interconnect structures with reduced electrical resistivity that is obtained by applying mechanical strain to the metallic interconnect structures, according to yet another embodiment of the invention. In one embodiment, the method of FIGS. 12-16 initially begins with formation of the semiconductor structure shown in FIG. 1, wherein FIG. 12 is a cross-sectional schematic side view of the semiconductor structure of FIG. 1 after patterning the ILD layer 130 to form a dual damascene opening 200 comprising a trench 201 and via opening 202. The dual damascene opening 200 can be formed using known dual damascene patterning techniques.

Figure 14:
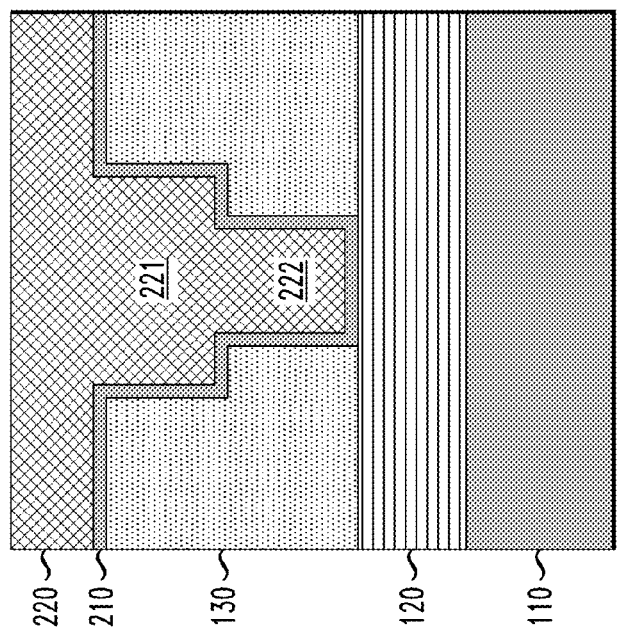
Figure 13:
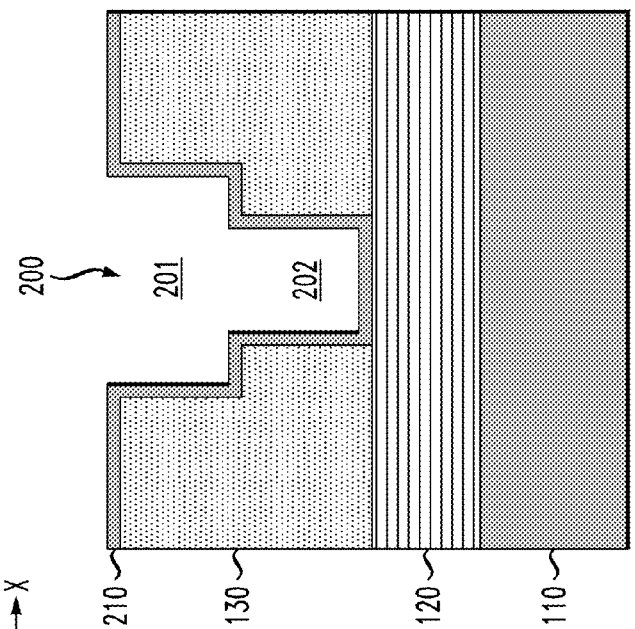

A next phase in the fabrication process comprises forming a metal interconnect structure in the ILD layer 130, using a process flow as schematically illustrated in FIGS. 13 and 14. In particular, FIG. 13 is a cross-sectional schematic side view of the semiconductor structure of FIG. 12 after depositing a conformal layer of liner material to line the surfaces of the dual damascene opening 200 in the ILD layer 130 with a thin liner layer 210. The thin liner layer 210 serves as a barrier diffusion layer and adhesion layer for the metallic material that is subsequently deposited to fill the dual damascene opening 200. The liner layer 210 may include one or more thin layers of material such as, for example, tantalum (Ta), tantalum nitride (TaN), titanium nitride (TiN), cobalt (Co), ruthenium (Ru), tungsten (W), tungsten nitride (WN), titanium-tungsten (TiW), tungsten nitride (WN) manganese (Mn), manganese nitride (MnN) or other liner materials (or combinations of liner materials) such as RuTaN, Ta/TaN, CoWP, NiMoP, NiMoB) which are suitable for the given application. The thin liner layer 210 is deposited using known techniques such as ALD, CVD, PVD, etc.

Next, FIG. 14 is a cross-sectional schematic side view of the semiconductor structure of FIG. 13 after depositing a layer of metallic material 220 to fill the trench 201 and via opening 202 with metallic material and form a metal line 221 and metal via 222. In one embodiment, the layer of metallic material 220 comprises copper. In other embodiments, the layer of metallic material 220 comprises a metallic material such as, but not limited to, aluminum, tungsten, cobalt, ruthenium, iridium, rhodium, nickel, or alloys thereof. The layer of metallic material 220 is deposited using known techniques such as electroplating, electroless plating, CVD, PVD, or a combination of methods. Prior to depositing the layer of metallic material 220, a thin seed layer (e.g., Cu seed layer) may optionally be deposited (on the conformal liner layer 210) using a suitable deposition technique such as ALD, CVD or PVD. The seed layer can be formed of a material which enhances adhesion of the metallic material on the underlying material and which serves as catalytic material during a subsequent plating process. For example, a thin conformal copper seed layer can be deposited over the surface of liner layer 210 using PVD, followed by the electroplating of copper to fill the dual damascene opening 201 and 202 with the metallic material 220, resulting in the semiconductor structure of FIG. 14.

Figure 15:
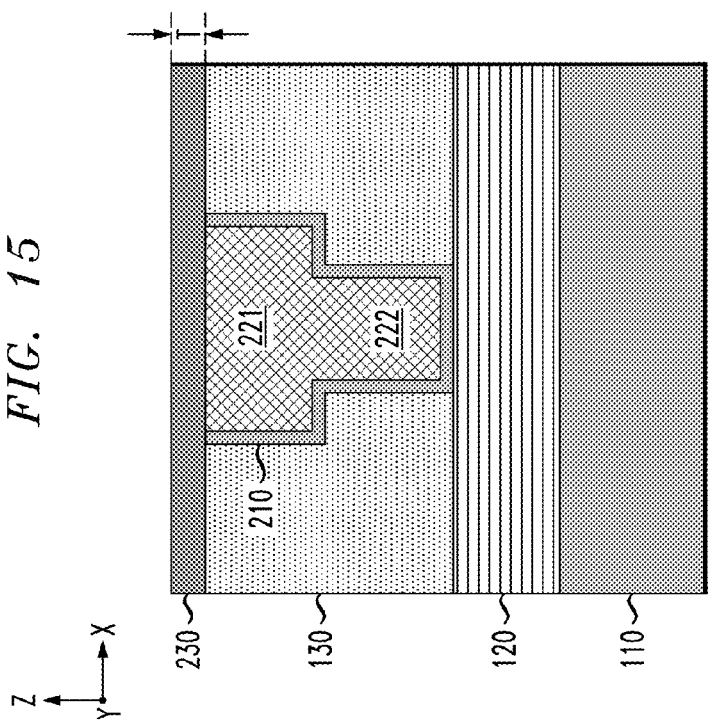

The overburden liner, seed, and metallization materials are then removed by performing CMP process to planarize the surface of the semiconductor structure down to the ILD layer 130. Following the CMP, a stress layer 230 is deposited on the planarized surface, resulting in the semiconductor structure shown in FIG. 15. In particular, FIG. 15 is a cross-sectional schematic side view of the semiconductor structure of FIG. 14 after planarizing the surface of the semiconductor structure down to the ILD layer 130, and depositing a layer of dielectric material on the planarized surface to form the stress layer 230. As with previously discussed embodiments, the stress layer 230 can be formed with a dielectric material (e.g., SiCN) that has a CTE which is greater than a CTE of the metallic material that forms the metal line 221 and metal via 222, and which is suitable to serve as a stress layer for the given application. In one embodiment, the stress layer 230 is formed with a thickness T (e.g., about 3 nm or more) which is sufficient to apply enough compressive stress to the underlying metallic interconnect 221/222 during a subsequent thermal anneal process to permanently deform at least a portion of the metallic interconnect 221/222 into a compressive stress memorized state, which serves to reduce the resistivity p of the metallic interconnect 221/222.

Figure 16:
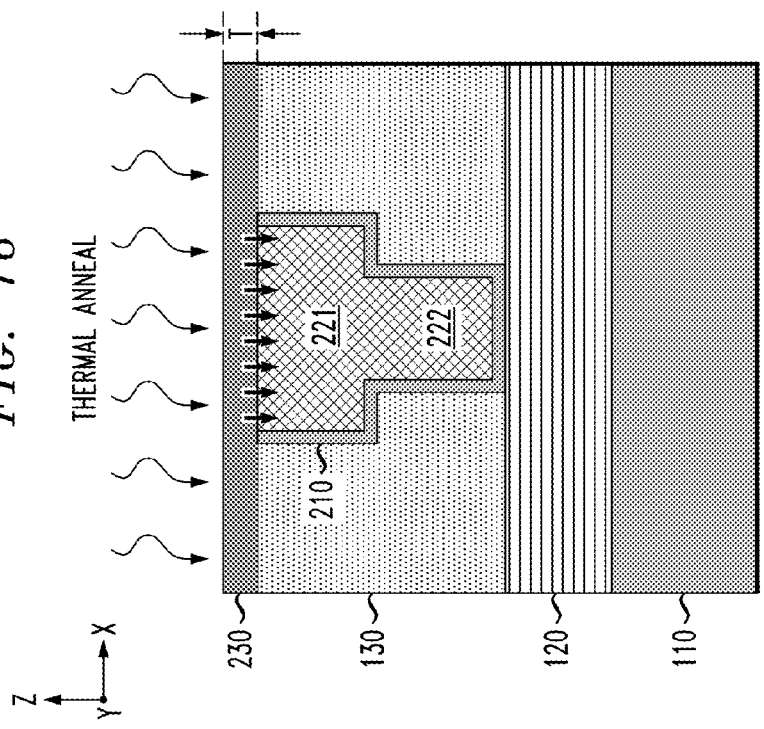

Referring now to FIG. 16, a next step in the fabrication process comprises performing a thermal anneal process to heat the stress layer 230 and cause the stress layer 230 to expand in the vertical direction (e.g., cause tensile strain within the stress layer 230) and apply a compressive force to the upper lateral surface of the underlying metallic interconnect structure 221 and 222, as indicated by the arrows shown in FIG. 16. As discussed above, the parameters of the thermal anneal process (e.g., temperature, time period, etc.) are selected so that the tensile strain (expansion) of the stress layer 230 causes a permanent compressive deformation of metallic material of the underlying metal line 221 and metal via 222 so that at least some or all of the metallic material of the metal line 221 and metal via 222 remain in a compressive stress memorized state with reduced electrical resistivity.

Following the thermal anneal process, in one embodiment, the stress layer 230 can be removed using known techniques, such as CMP. Following removal of the stress layer 230, a thin dielectric capping layer (e.g., SiN) can be formed on the planarized surface of the semiconductor structure, followed by the deposition of an ILD layer which is patterned and processed to form another level of metallization of the BEOL interconnect structure. In another embodiment of the invention, depending on the material used to form the stress layer 230 shown in FIGS. 15 and 16, the stress layer 230 can be maintained to serve as a dielectric capping layer for the metallic interconnect 221/222 and other metallization formed in the ILD layer 130.

It is to be understood that the process modules discussed herein for fabricating low resistance BEOL interconnect structures can be incorporated within semiconductor processing flows for fabricating semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method, comprising:
    forming a metallic interconnect structure in an interlevel dielectric (ILD) layer of a back-end-of-line (BEOL) structure of a semiconductor structure;
    forming a stress layer in contact with the metallic interconnect structure, wherein forming the stress layer in contact with the metallic interconnect structure comprises:
        forming a recessed region in the ILD layer surrounding the metallic interconnect structure; and
        depositing a layer of dielectric material in the recessed region to form the stress layer, wherein the stress layer is in contact with at least an upper surface and sidewalls of the metallic interconnect structure;
    performing a thermal anneal process to cause the stress layer to expand and apply a compressive force to the metallic interconnect structure and permanently deform at least a portion of the metallic interconnect structure into a stress memorized state of compressive strain;
    removing the stress layer after the thermal anneal process is performed; and
    depositing a second layer of dielectric material to refill the recessed region of the ILD layer with dielectric material.

2. The method of claim 1, wherein the stress layer is formed of a dielectric material that has a thermal coefficient of expansion (CTE) which is greater than a CTE of a metallic material that forms the metallic interconnect structure.

3. The method of claim 1, wherein a portion of the stress layer in contact with the metallic interconnect structure has a thickness of not less than about 3 nanometers.

4. The method of claim 1, wherein the stress layer comprises silicon carbon nitride (SiCN).

5. The method of claim 1, wherein the metallic interconnect structure comprises one of copper and aluminum.

6. The method of claim 1, wherein the metallic interconnect structure comprises one of a metal wire, and a metal via.

7. The method of claim 1, wherein depositing the layer of dielectric material to form the stress layer comprises depositing a non-conformal layer of dielectric material to cover the upper surface and the sidewalls of the metallic interconnect structure with the dielectric material of the stress layer, and to form air gaps in the dielectric material of the stress layer adjacent to the sidewalls of the metallic interconnect structure.

8. The method of claim 1, wherein depositing the layer of dielectric material to form the stress layer comprises depositing a conformal layer of dielectric material to completely fill the recessed region of the ILD layer with the dielectric material of the stress layer.

9. The method of claim 1, wherein the metallic interconnect structure comprises a metal wire having a width W in a range of about 2 nm to about 25 nm, and an aspect ratio of not more than 2.6.

10. The method of claim 1, wherein the second layer of dielectric material and the ILD layer are formed of a same dielectric material.

11. The method of claim 1, wherein the second layer of dielectric material and the ILD layer are formed of different dielectric materials.

12. The method of claim 1, wherein the second layer of dielectric material comprises one of SiN, SiCN, SiNO, SiCNO, SiBN, SiCBN, SiC, and SiCOH.

13. The method of claim 1, wherein depositing the second layer of dielectric material to refill the recessed region of the ILD layer with dielectric material, comprises:
    depositing a layer of dielectric material over the ILD layer to fill the recessed region of the ILD layer with the dielectric material; and
    planarizing a surface of the semiconductor structure to remove an overburden portion of the layer of dielectric material down to an upper surface of the ILD layer.

14. The method of claim 13, further comprising forming a dielectric capping layer on the planarized surface of the semiconductor structure.

* * * * *